United States Patent
Suzuki (10) Patent No.: US 7,656,038 B2
(45) Date of Patent: Feb. 2, 2010

(54) SUBSTRATE SHEET, MANUFACTURING METHOD OF CIRCUIT SUBSTRATE, AND INK JET HEAD

(75) Inventor: Shigeru Suzuki, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 494 days.

(21) Appl. No.: 11/490,204

(22) Filed: Jul. 21, 2006

(65) Prior Publication Data
US 2007/0019060 A1 Jan. 25, 2007

(30) Foreign Application Priority Data
Jul. 22, 2005 (JP) .............. 2005-213382

(51) Int. Cl.
*H01L 23/48* (2006.01)
(52) U.S. Cl. .............. 257/773; 257/701; 257/702; 257/E23.01
(58) Field of Classification Search ........... 257/773, 257/701, 702, E23.07, E23.01, E23.02; 347/138
See application file for complete search history.

(56) References Cited

U.S. PATENT DOCUMENTS

| 6,977,431 | B1 * | 12/2005 | Oh et al. ............ 257/696 |
| 2003/0063449 | A1 | 4/2003 | Suzuki et al. |
| 2003/0127662 | A1 * | 7/2003 | Duesman et al. ........ 257/198 |

FOREIGN PATENT DOCUMENTS

| JP | 3270197 | 1/2002 |
| JP | 200380683 | 3/2003 |

* cited by examiner

*Primary Examiner*—Leonardo Andújar
(74) *Attorney, Agent, or Firm*—Baker Botts L.L.P.

(57) ABSTRACT

A plurality of external electrodes 11*c*, 11*m* are disposed in parallel along two sides facing each other of a region 300 corresponding to the circuit substrate to be manufactured, and a probing electrode is formed, which is connected to the external electrodes through extending conductors 13*a*, 13*b* extending to the outside the region 300 from the external electrodes. At this time, widths of the extending conductors 13*a*, 13*b* are set smaller than the widths of the external electrodes 11*c*, 11*m* and probing electrodes 12*a*, 12*b*. Therefore, a solder storage part is formed in a wide portion in a width changing part between an electrode and a conductor, and a necessary sufficient amount of solder is adhered to the surfaces of the external electrodes 11*c*, 11*m*.

7 Claims, 12 Drawing Sheets

SUBSTRATE SHEET, MANUFACTURING METHOD OF CIRCUIT SUBSTRATE, AND INK JET HEAD

CROSS-REFERENCE TO RELATED APPLICATIONS

This nonprovisional Application claims priority under 35 U.S.C. §119(a) on Patent Application No. 2005-213382 in Japan on Jul. 22, 2005, the entire contents of which are hereby incorporated by reference.

BACKGROUND

The present invention relates to a substrate sheet formed with external electrodes, wiring, and probing electrodes on one surface, a manufacturing method of a circuit substrate using the substrate sheet and an ink jet head equipped with the circuit substrate.

The ink jet head records an image such as a character and pattern on a recording paper by ejecting an ink from its nozzle hole, while moving relatively to the recording paper. A plurality of lines of lined-up nozzle holes along a moving direction of the recording paper are arranged in parallel. The ink jet head comprises a cavity plate on which a channel is formed for feeding ink to each nozzle hole. In addition, the ink jet head is layered on the cavity plate, and comprises a plate-like actuator (such as a piezoelectric device) for ejecting ink from each nozzle hole, respectively. Further, the ink jet head comprises a circuit substrate layered on the actuator, for connecting the actuator and an IC chip that drives the actuator.

An individual electrode corresponding to each nozzle hole and an earth electrode for earthing are formed on one surface of the actuator. A drive signal for driving the actuator is given to the individual electrode, through an external electrode formed on the circuit substrate (see Japanese Patent Publication No. 3270197).

Figure 1:
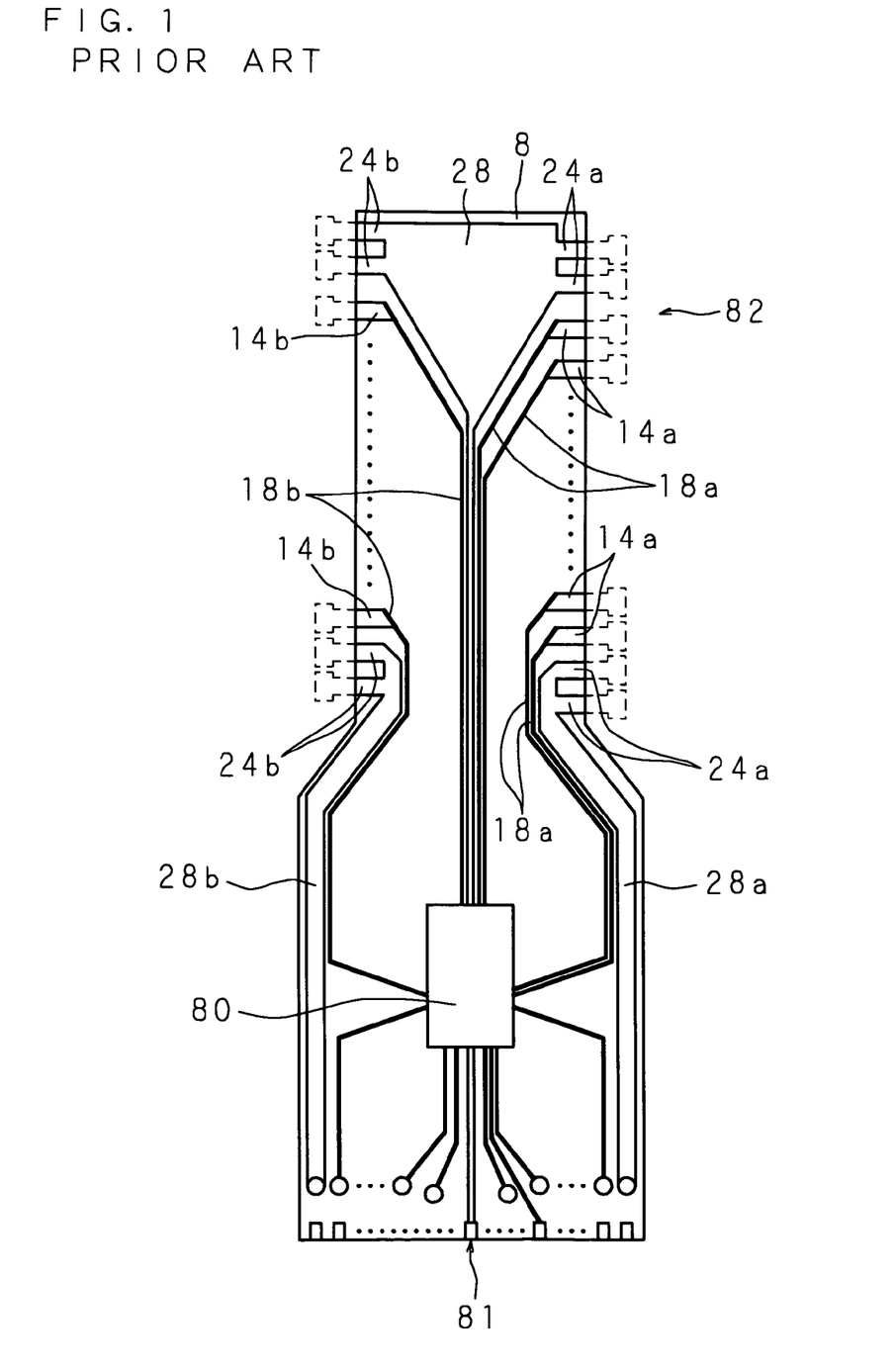
FIG. 1 is a plan view showing a construction of a conventional circuit substrate.

FIG. 1 is a plan view showing a construction of a conventional circuit substrate (Japanese Patent Application Laid-Open No. 2003-80683). The circuit substrate is formed by arranging an IC chip 80, a terminal part 81 and an electrode part 82 on an substantially rectangular flexible insulating film 8 made of polyimide. In the insulating film 8, the width of one end in a longitudinal direction of the insulating film 8 is larger than the width of the other end. The aforementioned one end is called a wide portion, and the other end is called a narrow portion, hereafter.

The IC chip 80 is mounted on a center of the wide portion, and the terminal part 81 is formed at a tip side in the length direction of the wide portion. The IC chip 80 outputs the drive signal to the actuator. In addition, an electric power and a signal for outputting the drive signal, or the like is supplied to the IC chip 80, through the terminal part 81.

Electrode parts 82 are formed in the narrow portion layered on one surface of the actuator. The electrode parts 82 are connected to the individual electrode and the earth electrode provided on one surface of the actuator. The electrode parts 82 are provided in parallel at both ends in a direction of the width of the narrow portion of the insulating film 8. External electrodes 24a, 24a, 14a, 14a, . . . 24a, 24a and external electrodes 24b, 24b, 14b, 14b, . . . , 24b, 24b are provided in this order, respectively as the electrode parts 82. Each external electrode 14a and 14b has an approximately square shape, and is connected to the individual electrode of the actuator. The external electrodes 14a, 14b are connected to the IC chip 80 through wirings 18a, 18b, respectively. The external electrodes 24a, 24b have an approximately square shape, and are connected to the earth electrode of the actuator. The external electrodes 24a, 24b are connected to the terminal part 81 through wirings 28a, 28b, respectively.

Figure 2:
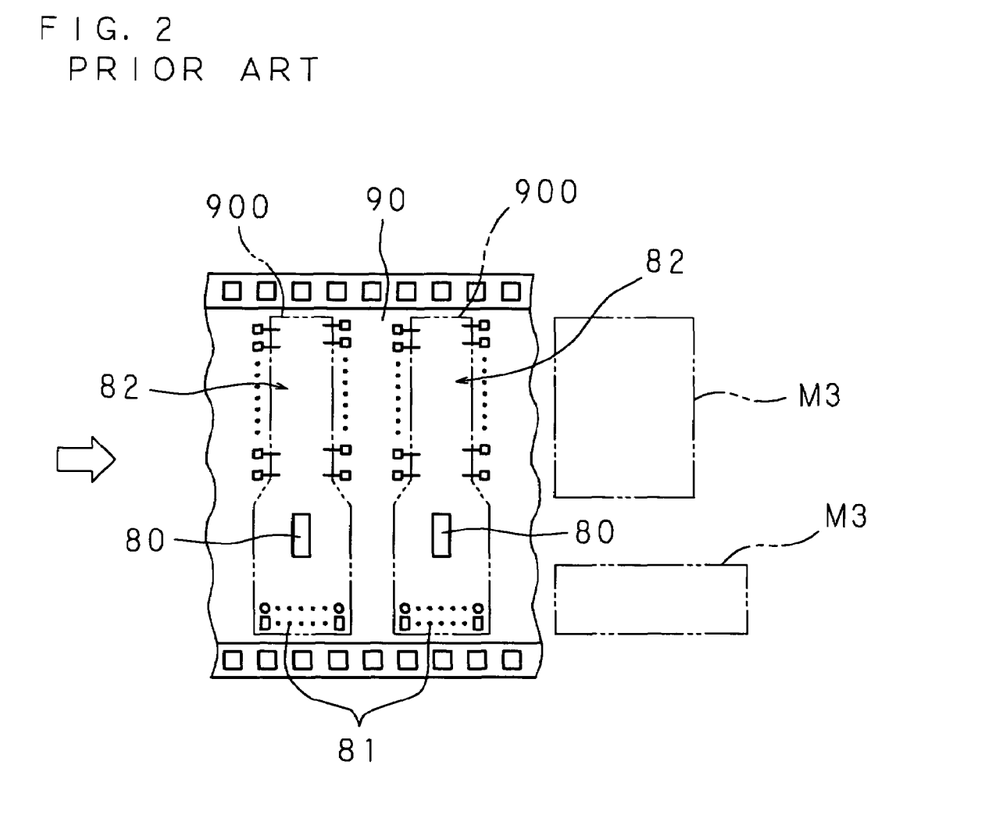
FIG. 2 is an explanatory view of a manufacturing method of the conventional circuit substrate.
Figure 3:
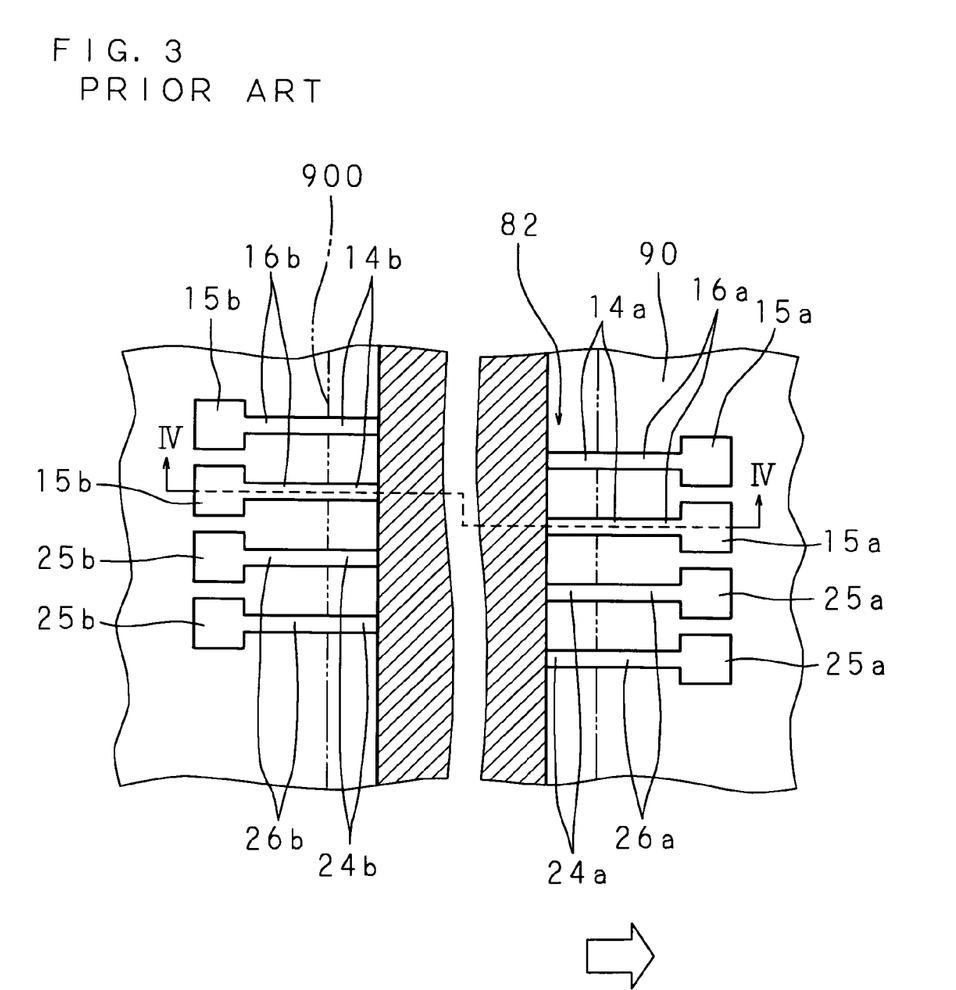
FIG. 3 is an expanded explanatory view of the manufacturing method of the conventional circuit substrate.
Figure 4:
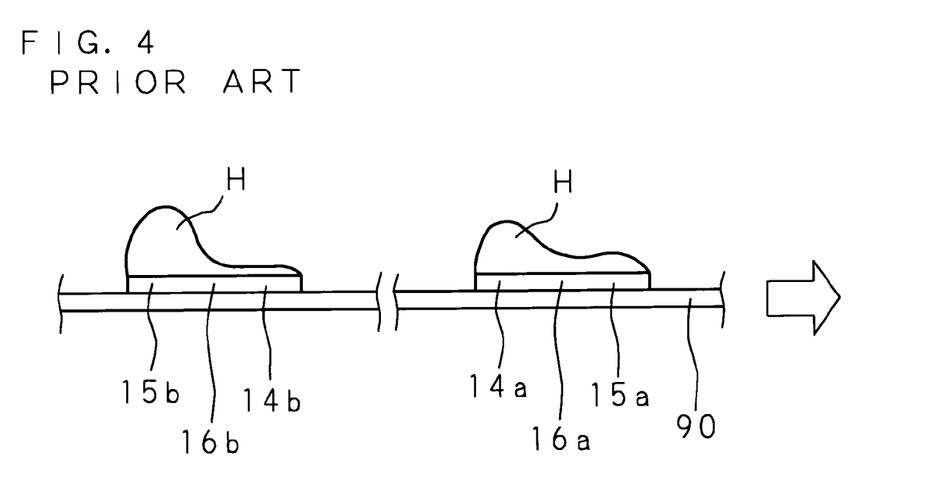
FIG. 4 is a sectional view taken along IV-IV line in FIG. 3.

FIG. 2, FIG. 3 and FIG. 4 are explanatory views of the manufacturing method of the conventional circuit substrate.

On a belt-like substrate sheet 90, a plurality of substantially rectangular regions 900 corresponding to the insulating film 8 of the circuit substrate are arranged in parallel in a lengthwise direction of the substrate sheet 90, so that the lengthwise direction of each region 900 is coincided with a widthwise direction of the substrate sheet 90. As will be described later, the circuit substrate is formed by cutting the substrate sheet 90 along outlines of the regions 900. Hereafter, one region 900 will be explained.

Belt-like extending conductors 16a, 26a and extending conductors 16b, 26b are provided in a state of extending to outside the regions 900 in widthwise directions of the regions 900 from the external electrodes 14a, 24a and the external electrodes 14b, 24b, respectively. An extending direction of each extending conductor 16a, 26a from each external electrode 14a, 24a, and an extending direction of each extending conductor 16b, 26b from each external electrode 14b, 24b are opposite to each other.

The width (width in a direction orthogonal to the extending direction) of each extending conductor 16a, 16b, 26a, 26b is approximately equal to the width of each external electrode 14a, 14b, 24a, 24b, and set at about 0.12 mm.

Substantially rectangular probing electrodes 15a, 15b, 25a, 25b connected to each external electrode 14a, 14b, 24a, 24b through each extending conductor 16a, 16b, 26a, 26b are formed outside the regions 900. The width of each probing electrode 15a, 15b, 25a, 25b is set larger than the width of each extending conductor 16a, 16b, 26a, 26b, and set at about 0.2 mm.

Each probing electrode 15a, 15b, 25a, 25b is used in a conduction test of each external electrode 14a, 14b, 24a, 24b, the IC chip 80, and the terminal part 81.

On the substrate sheet, solder H, which is a conductive brazing material for connecting each external electrode 14a, 14b, 24a, 24b and the actuator, is adhered to the surface of each external electrode 14a, 14b, 24a, 24b, before the circuit substrate is formed. In addition, the solder H for connecting the terminal part 81 and an external connector is adhered to the terminal part 81.

Therefore, the substrate sheet moves in the lengthwise direction (in a direction shown by hollow arrow in the figure) of the substrate sheet, with a surface (referred to as an electrode forming face hereafter) on which each external electrode 14a, 14b, 24a, 24b and the terminal part 81 are formed, faced downside, and passes over solder tanks M3, M3 for blowing up solder previously heated and fused, for each external electrode 14a, 14b, 24a, 24b and the terminal part 81. However, a part, on which the IC chip 80 is mounted, does not pass over the solder tank M3.

The solder is hardly adhered to the insulating film 8, and meanwhile, the solder is adhered to the surface of each external electrode 14a, 14b, 24a, 24b, each probing electrode 15a, 15b, 25a, 25b, and each extending conductor 16a, 16b, 26a, 26b, and the terminal part 81. The solder H thus adhered thereto is cured once. Then, the solder H thus adhered is heated and fused again, at the time point of connecting the individual electrode, the earth electrode, and each external electrode 14a, 14b, 24a, 24b, and at the time point of connecting the connector and the terminal part 81.

The conduction test is performed before or after adhesion of solder H. After completing the conduction test, the substrate sheet is cut along the outline of the region 900, before being connected to the actuator. Thus, the circuit substrate including each external electrode 14a, 14b, 24a, 24b, and not including each probing electrode 15a, 15b, 25a, 25b and each extending conductor 16a, 16b, 26a, 26b is formed. The substrate sheet is cut at a connection part (shown by two dot chain line in FIG. 3) of each external electrode 14a, 14b, 24a, 24b, and each extending conductor 16a, 16b, 26a, 26b, for example.

BRIEF SUMMARY

For example, as shown in FIG. 4, an external electrode 14a, an extending conductor 16a, and a probing electrode 15a are continuously formed in a moving direction of the substrate sheet. Therefore, the solder H, which is a conductive brazing material integrally adhered to the surfaces of the probing electrode 15a, the extending conductor 16a, and the external electrode 14a, flows to the tail end in the moving direction from the top end in the moving direction by a surface tension of the solder, when the electrodes 14a, 16a, 15a of the substrate sheet passes over the solder tank M3. Therefore, an amount of the solder H adhered to the surface of the probing electrode 15a at the top end side in the moving direction is small, and an amount of the solder H adhered to the surface of the external electrode 14a at the tail end side in the moving direction is large.

Similarly, the amount of the solder H adhered to the surface of the external electrode 14b at the top end side in the moving direction is small, and the amount of the solder H adhered to the surface of the probing electrode 15b at the tail end side in the moving direction is large. Also, similarly, the amount of the solder H adhered to the surfaces of the probing electrode 25a and the external electrode 24b at the top end side in the moving direction is small, and the amount of the solder H adhered to the surfaces of the external electrode 24a and the probing electrode 25b at the tail end side in the moving direction is large.

When each external electrode 14a, 14b and each external electrode 24a, 24b of the circuit substrate is respectively connected to the individual electrode and the earth electrode provided in the actuator, the circuit substrate is arranged at the upside of the actuator. The solder H on the surface of each external electrode 14a, 14b and each external electrode 24a, 24b is heated and fused from the surface opposite to an electrode forming face of the circuit substrate, and the external electrodes 14a, 14b and the external electrodes 24a, 24b are respectively connected to the individual electrode and the earth electrode.

In a connection method of electrodes by the solder H as described above, even if the solder H on all the external electrodes are totally and uniformly heated, it requires time if the solder H on the external electrodes 14a, 24a with large adhesive amount is fused by heating. Therefore, the solder H which is not yet fused and cured on the external electrodes 14a, 24a becomes a spacer between the insulating film 8 and the actuator. Accordingly, the solder H which is fused on the external electrodes 14b, 24b can not be brought into contact with the individual electrode and the earth electrode, and this causes a connection failure in some cases.

Meanwhile, although the solder H on the external electrodes 14b, 24b with small adhesive amount is uniformly fused by heating, an adhesive deficiency of solder causes the connection failure in some cases even when the external electrodes 14b, 24b are brought into contact with the individual electrode and the earth electrode. When a heat treatment is performed so that a connection is ensured even with such a small solder amount, an extra solder H is generated by the solder H on the external electrodes 14a, 24a with large adhesive amount, and this may sometimes cause a short-circuiting of the adjacent external electrodes 14a, 24a to each other.

In view of the above-described circumstances, the present invention is provided, and an object of the present invention is to provide a substrate sheet that allows a conductive brazing material of necessary sufficient amount to be adhered to each external electrode by setting a width of an extending conductor provided in a state of extending to a probing electrode from the external electrode to be smaller than the width of the external electrode and the probing electrode, and a manufacturing method of a circuit substrate.

Another object of the present invention is to provide the substrate sheet capable of reducing a difference of the conductive brazing material adhered to the surface of each external electrode arranged in parallel along two sides provided facing each other of a region corresponding to the circuit substrate to be manufactured.

Still another object of the present invention is to provide the substrate sheet capable of forming sufficiently large probing electrodes by arranging the probing electrodes at different positions in a direction of the extending conductor, and setting a separation distance to be small between the external electrodes adjacent to each other in a widthwise direction of the extending conductor.

According to an aspect, there is provided a substrate sheet, on one surface thereof comprising:

a plurality of external electrodes provided inside an substantially rectangular region corresponding to a circuit substrate to be manufactured along at least one side of the region, to connect with external equipment;

an extending conductor extending from the external electrodes to the outside the region; and a probing electrode connected to the external electrodes through the extending conductor to perform a conduction test, wherein a width of the extending conductor is smaller than a length of the extending conductor of each external electrode and probing electrode in a widthwise direction.

According to an aspect, there is provided a manufacturing method of a circuit substrate, comprising the steps of:

making a conductive brazing material adhered to the surfaces of the external electrodes while the substrate sheet is moved in the lengthwise direction of the extending conductor; and after adhesion of the wax material, cutting the region and forming a circuit substrate comprising the external electrodes.

According to an aspect, there is provided an ink jet head on which at least one ink cartridge is mounted, comprising:

a frame for freely removably holding the aforementioned at least one ink cartridge;

a substrate provided at one side of the frame, having a connector at one side edge thereof for supplying a signal;

a circuit substrate connected to the connector and manufactured by the manufacturing method of the circuit substrate; and a recording head provided at other side of the frame, having a plurality of nozzle holes for ejecting an ink fed from the aforementioned at least one ink cartridge to a recording medium, wherein the recording head is connected to external electrodes of the circuit substrate.

In the substrate sheet, the manufacturing method of the circuit substrate, and the ink jet head of the above-mentioned aspects, the width of the extending conductor is formed smaller than the widths of the external electrodes and the probing electrode. Therefore, when the conductive brazing material is adhered to the surfaces of the external electrodes, a wide portion of the external electrodes in the vicinity of a connection section between the external electrodes and the extending conductors, each having changeable widths, becomes a storage part of the conductive brazing material. Accordingly, a sufficient amount of conductive brazing material can be adhered to the surfaces of the external electrodes. Therefore, an excellent connection of the external electrodes, external equipment and for example the recording head can be obtained.

In addition, by cutting the substrate sheet, when the extending conductors and the probing electrodes are removed to be used as the circuit substrate, an excellent connection between the electrode of the external equipment such as a recording head, and the external electrodes can be obtained, because a necessary sufficient amount of conductive brazing material is adhered to the surfaces of the external electrodes.

The above and further objects and features will more fully be apparent from the following detailed description with accompanying drawings.

DETAILED DESCRITPION

Figure 5:
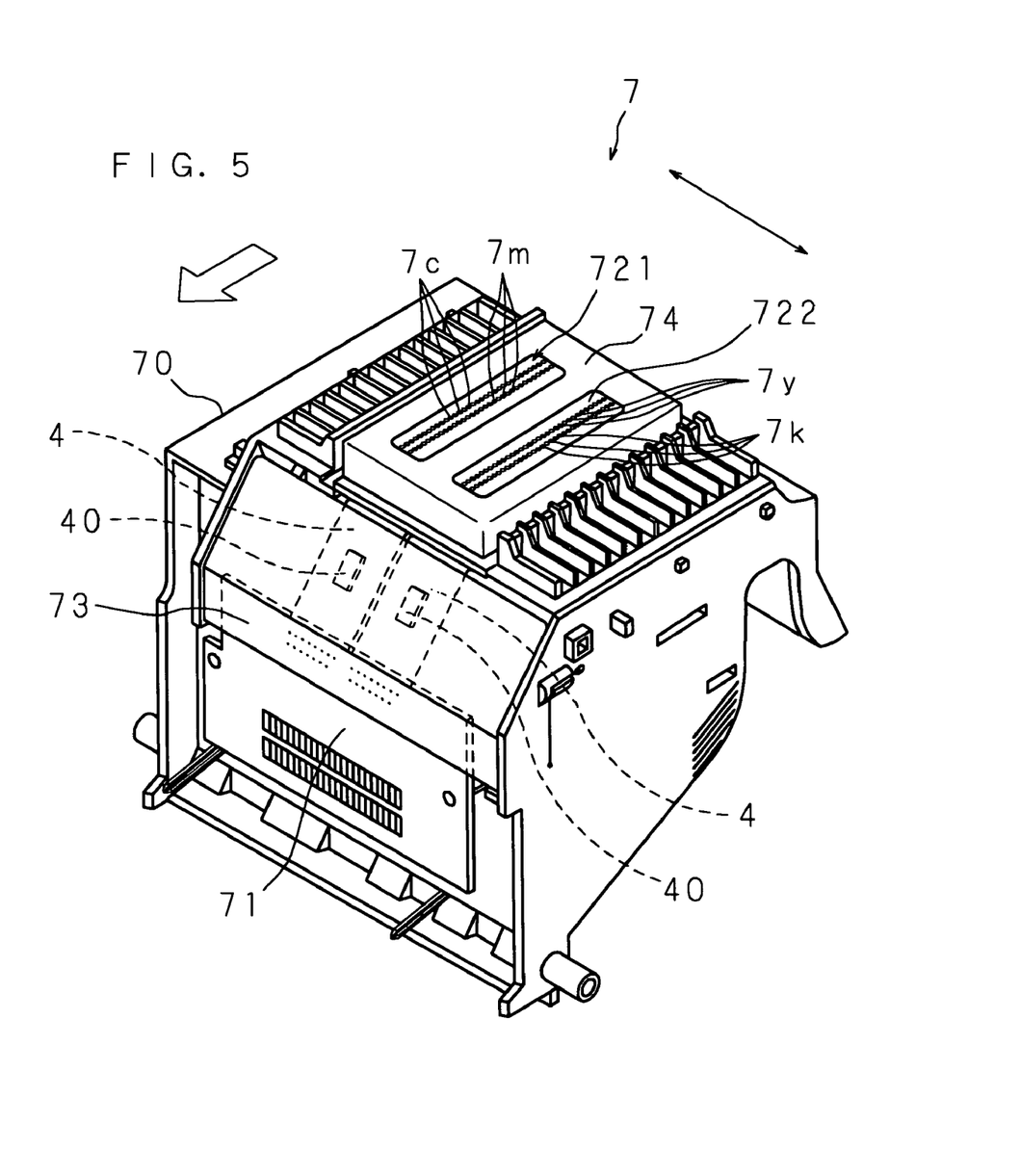
FIG. 5 is a perspective view showing the construction of an ink jet head comprising the circuit substrate manufactured in accordance with a manufacturing method of the circuit substrate according to the present invention.
Figure 6:
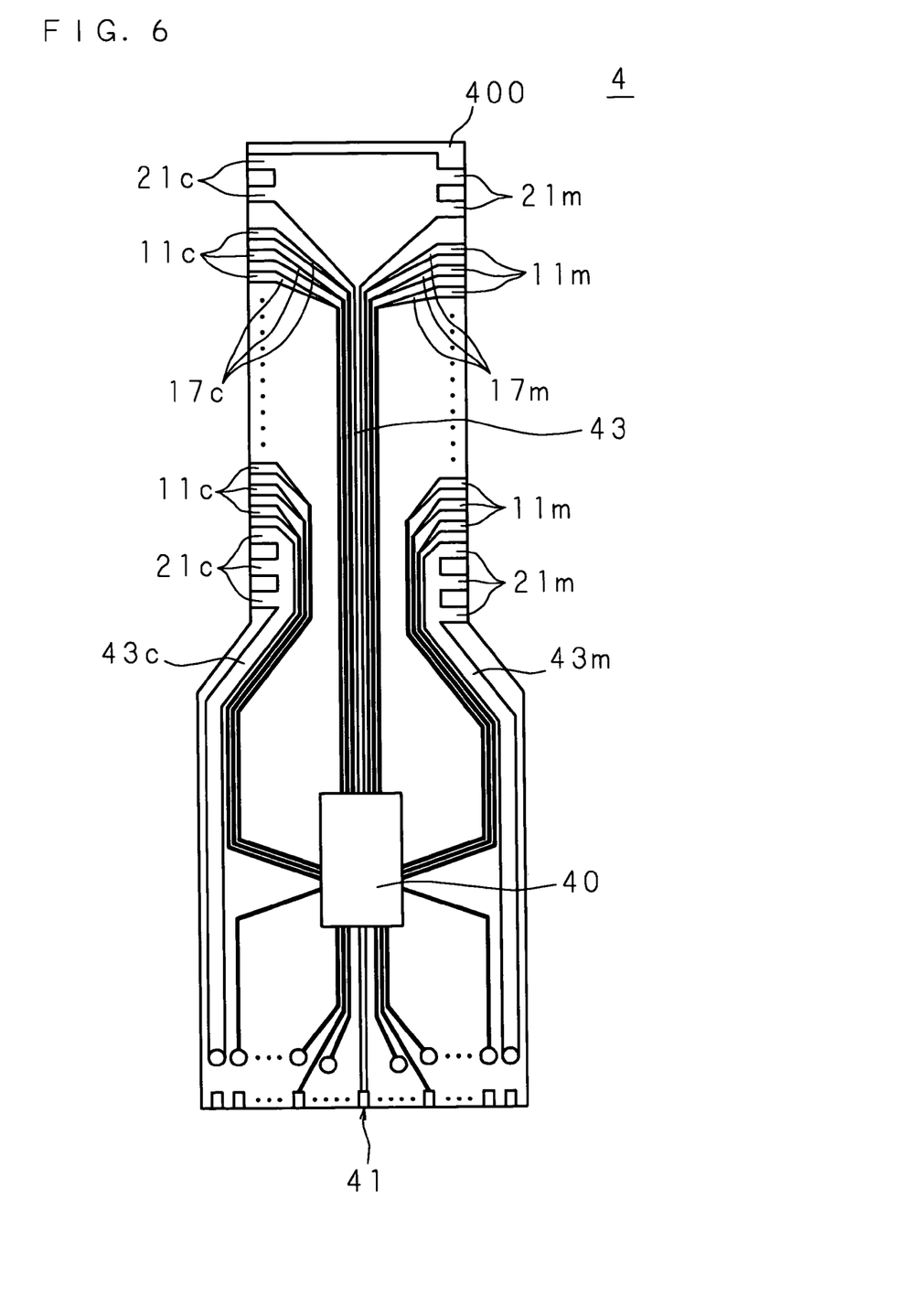
FIG. 6 is a plan view showing the construction of the circuit substrate manufactured in accordance with the manufacturing method of the circuit substrate according to the present invention.
Figure 7:
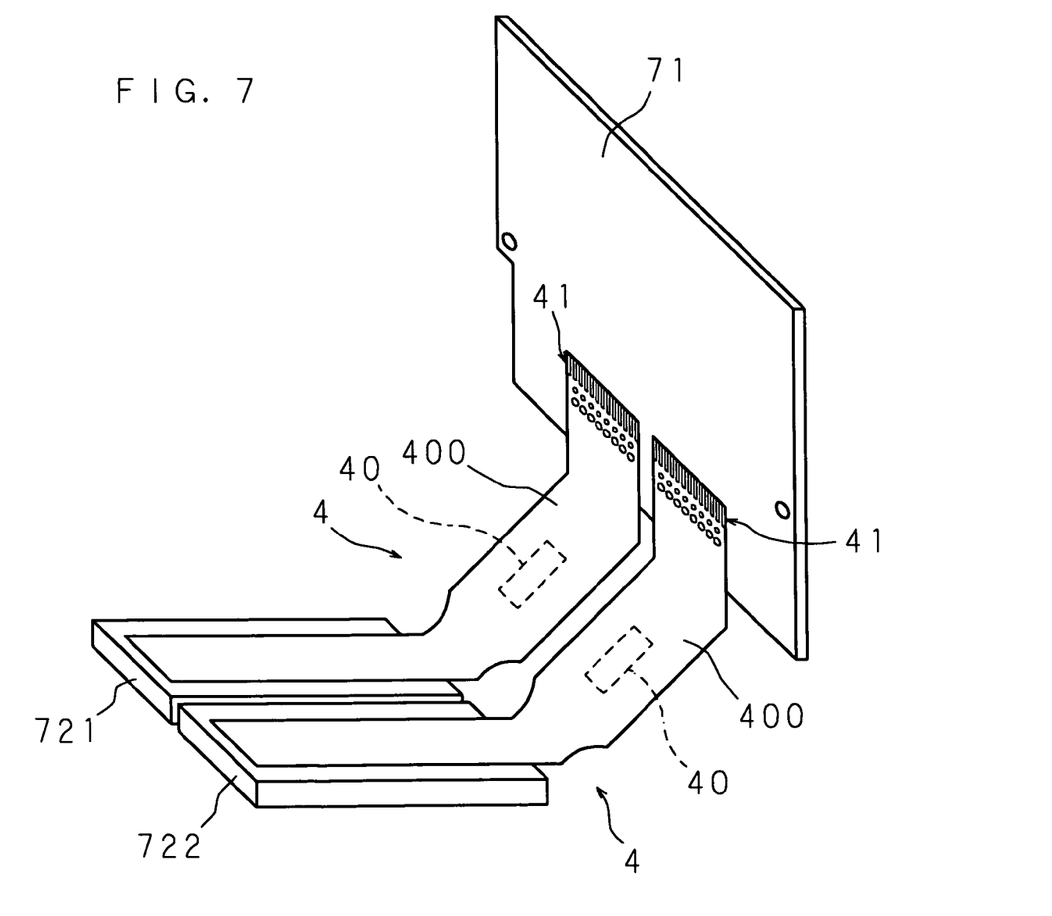
FIG. 7 is a perspective view showing the circuit substrate manufactured in accordance with the manufacturing method of the circuit substrate according to the present invention, and a state in which a print board and a recording head provided in the ink jet head are connected.
Figure 8:
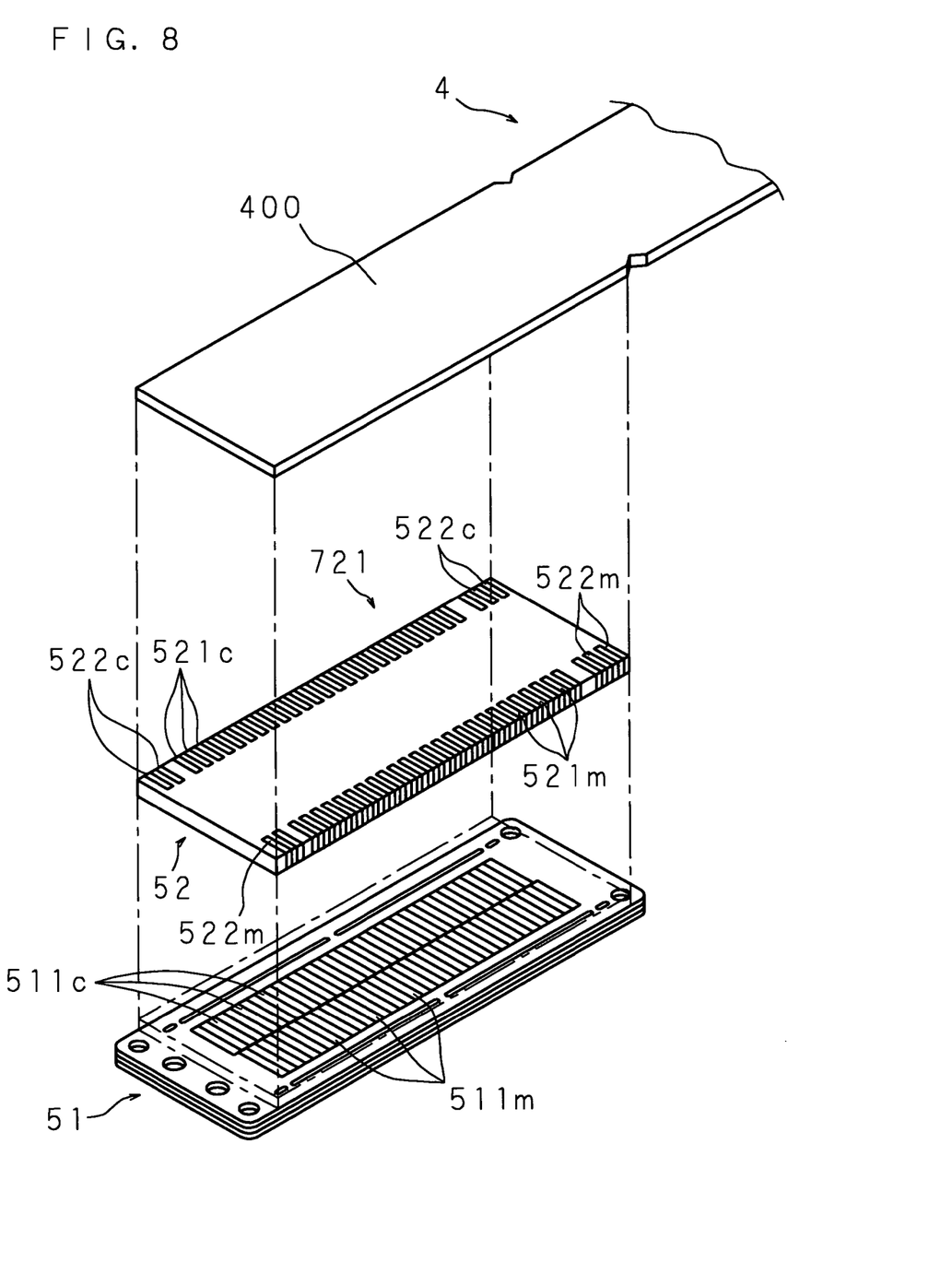
FIG. 8 is a perspective view explaining a connection between the circuit substrate and the recording head manufactured in accordance with the manufacturing method of the circuit substrate according to the present invention.

Hereafter, the present invention will be explained in detail based on the drawings showing embodiments thereof FIG. 5 is a perspective view showing a construction of an ink jet head 7 provided on circuit substrates 4,4, manufactured in accordance with a manufacturing method of a circuit substrate according to the present invention. FIG. 5 shows the ink jet head 7, with its bottom, where nozzle holes 7c, 7m, 7y, 7k as will be described later, faced upside. Also, FIG. 6 is a plan view showing a construction of the circuit substrate 4. Further, FIG. 7 is a perspective view showing a state in which the circuit substrates 4, 4, and a print board 71 and recording heads 721, 722 provided in the ink jet head 7 are connected, and FIG. 8 is a perspective view explaining a connection between the circuit substrate 4 and the recording head 721.

The ink jet head 7 freely removably fitted inside a printer not shown is made of synthetic resin. The ink jet head 7 is constructed by placing two recording heads 721 and 722 in parallel in a frame 70 formed in a box shape having a top opening. Each recording head is disposed so as to be opposed to an upper side of a recording paper transferred (paper-fed) in a direction of a hollow arrow in FIG. 5. Each recording head performs a reciprocal movement in a direction orthogonal to a paper-feeding direction (in a direction shown by arrow in FIG. 5).

The ink cartridge not shown for accommodating color ink such as cyan, magenta, yellow, and black is freely removably attached to the frame 70 from the top opening. Hereafter, c, m, y, k are respectively attached at the end of reference numerals to show correspondence to cyan, magenta, yellow, and black.

A print board 71 connected to a control circuit of the printer is disposed at one lateral side of the frame 70. Also, the recording heads 721 and 722 are placed in parallel at the bottom of the frame 70, so as to have a plurality of nozzle holes 7c, 7m, 7y, 7k as downward openings.

The recording heads 721 and 722 are covered with a cover plate 74 constructed, so that the nozzle holes 7c, 7m, 7y, 7k are exposed.

The ink jet head 7 comprises the circuit substrates 4, 4 corresponding to the recording heads 721, 722, respectively. Since the recording heads 721, 722 are approximately similarly constructed, the construction of the recording head 721 will be mainly explained hereafter. When the ink stored in the ink cartridge is fed, the recording head 721 ejects the ink from the nozzle holes 7c, 7m to the recording paper. The nozzle holes 7c, 7m form one line in each line in the paper feeding direction, and a zigzag arrangement is formed by the lines thus formed. A direction of the line is along the lengthwise direction of the recording head 721.

As shown in FIG. 8, the recording head 721 is constructed by placing a piezoelectric actuator plate 52 and a cavity plate 51 one over the other. The cavity plate 51 comprises channels 511c, 511m corresponding to the nozzle holes 7c, 7m in the paper feeding direction by one line, thus forming a zigzag arrangement.

The piezoelectric actuator plate 52 has active parts corresponding to the channels 511c, 511m.First individual electrodes 521c, 521m corresponding to each active part are provided by one line on the upper surface of the piezoelectric actuator plate 52 in the paper feeding direction. Each line forms the zigzag arrangement. A drive signal for driving the corresponding active part is given to the first individual electrodes 521c, 521m to make the ink ejected from the corresponding nozzle holes 7c, 7m.

In addition, on the upper surface of the piezoelectric actuator plate 52, first earth electrodes 522c, 522c, 522m, 522m connected to an end portion of a common potential side of each active part are formed on both ends of the line of the first individual electrodes 521c, 521m, respectively.

The first earth electrodes 522c, 522c, the first individual electrodes 521c, 521c, and the first earth electrodes 522c, 522c, 522c are provided in this order in parallel at one of facing lateral sides of the piezoelectric actuator plate 52. Also, the first earth electrodes 522m, 522m, the first individual electrodes 521*m*, 521*m*, and the first earth electrodes 522*m*, 522*m*, 522*m* are provided in parallel in this order at the other lateral side of the piezoelectric actuator plate 52. The electrode of one of the lateral sides is positioned so as to be shifted by ½ pitch from the electrode of the other side edge. It should be noted that the reason why two or three earth electrodes 522*c* 522*m* are placed at the end of each line of the first individual electrodes 521*c*, 521*m* is that a larger connection area at the common potential side is thereby obtained. Also, there are a plurality of external earth electrodes 21*c*, 21*m* connected thereto, as will be described later, for one wiring 43, 43*c*, 43*m*.

As shown in FIG. 6, the circuit substrate 4 is formed by arranging an IC chip 40, a terminal part 41, and an electrode part 42 on a flexible insulating film 400 made of polyimide, being an approximately rectangular. In the insulating film 400, the width of one end in the longitudinal direction of the insulating film 400 is larger than the width of the other end. Hereafter, the one end is referred to as a wide portion, and the other end is referred to as a narrow portion. The IC chip 40 is mounted on the center of the wide portion, and the terminal part 41 is formed at a tip side in the longitudinal direction of the insulating film 400 of the wide portion.

The IC chip 40 outputs a drive signal to the first individual electrodes 521*c*, 521*m*. The terminal part 41 is connected to the connector not shown formed on the print board 71. A signal, etc, for outputting electric power or drive signal is supplied to the IC chip 40 from the control circuit of the printer through the print board 71.

Further, the circuit substrates 4, 4, on which the IC chips 40, 40 are mounted, are covered with a cover plate 73 also serving as a heat sink.

The narrow portion of the circuit substrate 4 is layered on the upper side of the piezoelectric actuator plate 52, and has a contour corresponding to the lines of the first individual electrodes 521*c*, 521*m*, and the first earth electrodes 522*c*, 522*m*.

In the circuit substrate 4, external individual electrodes 11*c* and external earth electrodes 21*c* corresponding to the first individual electrodes 521*c* and the first earth electrodes 522*c* are formed in the contour portion corresponding to one lateral side of the piezoelectric actuator plate 52. External individual electrodes 11*m* and external earth electrodes 21*m* corresponding to the first individual electrodes 521*m* and the first earth electrodes 522*m* are formed in the contour portion corresponding to the other lateral side.

The external earth electrodes 21*c*, 21*c*, the external individual electrodes 11*c* and the external earth electrodes 21*c*, 21*c*, 21*c* are provided in parallel in this order along one lateral side of the narrow portion of the insulating film 400. The external earth electrodes 21*m*, 21*m*, the external individual electrodes 11*m*, and the external earth electrodes 21*m*, 21*m*, 21*m* are provided in parallel in this order along the other lateral side facing one lateral side of the narrow portion of the insulating film 400. The electrode of one lateral side is positioned shifted by ½ pitch from the electrode of the other lateral side. That is, the electrode of one lateral side and the electrode of the other lateral side form a zigzag arrangement. The widths of the external individual electrodes 11*c*, 11*m* are approximately equal to each other, and set at about 0.17 mm. The widths of the external earth electrodes 21*c*, 21*m* are approximately equal to each other, larger than the widths of the external individual electrodes 11*c*, 11*m*, and set at about 0.2 mm.

The external individual electrodes 11*c*, 11*m* are connected to the IC chip 40 through wirings 17*c*, 17*m*. In the narrow portion of the insulating film 400, the external earth electrodes 21*c*, 21*c*, 21*c* and the external earth electrodes 21*m*, 21*m*, 21*m* inside the insulating film in the lengthwise direction are respectively connected to the terminal part 41 through the wiring 43*c* and the wiring 43*m*, and are respectively grounded through the terminal part 41. In the narrow portion of the insulating film 400, the external earth electrodes 21*c*, 21*c*, 21*m*, 21*m* outside the insulting film in the lengthwise direction are all connected to the IC chip 40 and the terminal part 41 through wiring 43, and are grounded through the terminal part 41.

Figure 9:
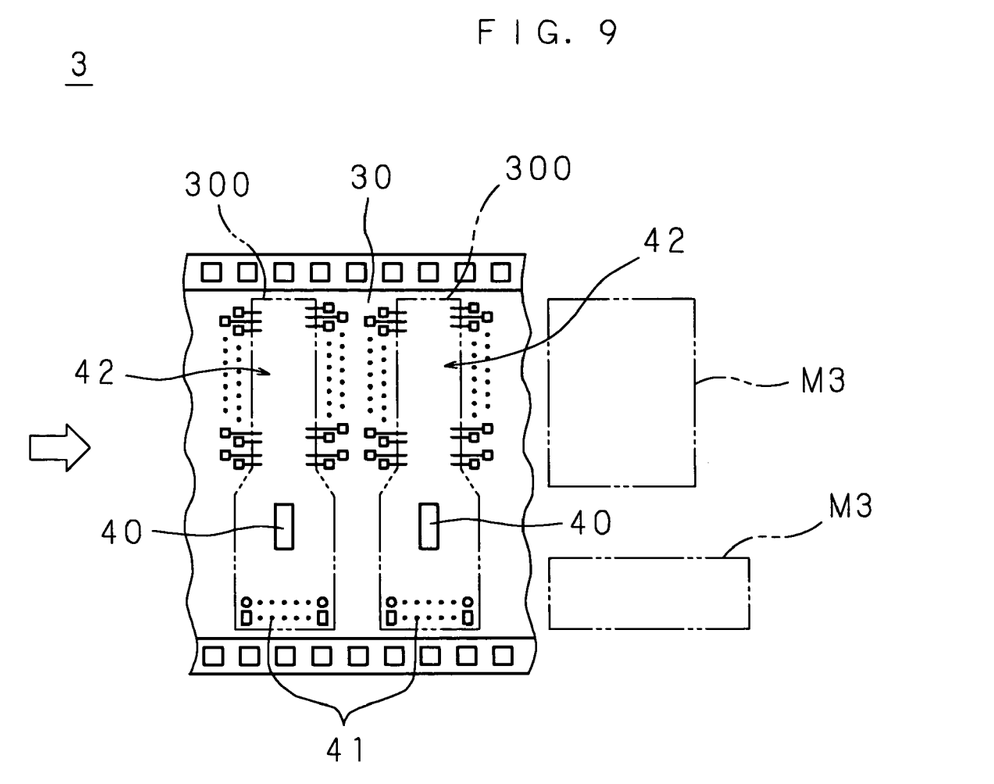
FIG. 9 is a plan view showing the construction of the substrate sheet according to the present invention.
Figure 10:
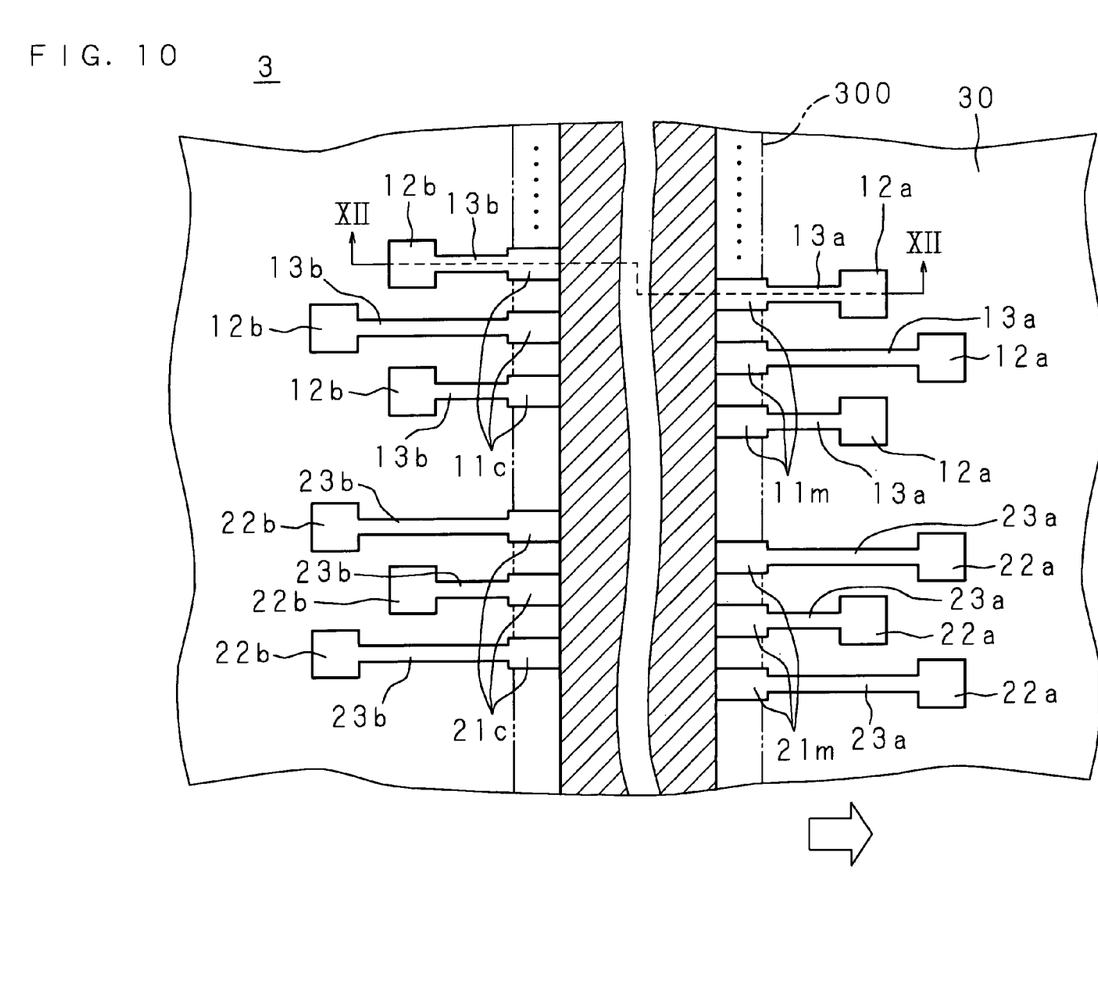
FIG. 10 is an expanded plan view showing the construction in the vicinity of external electrodes provided on the substrate sheet according to the present invention.
Figure 11:
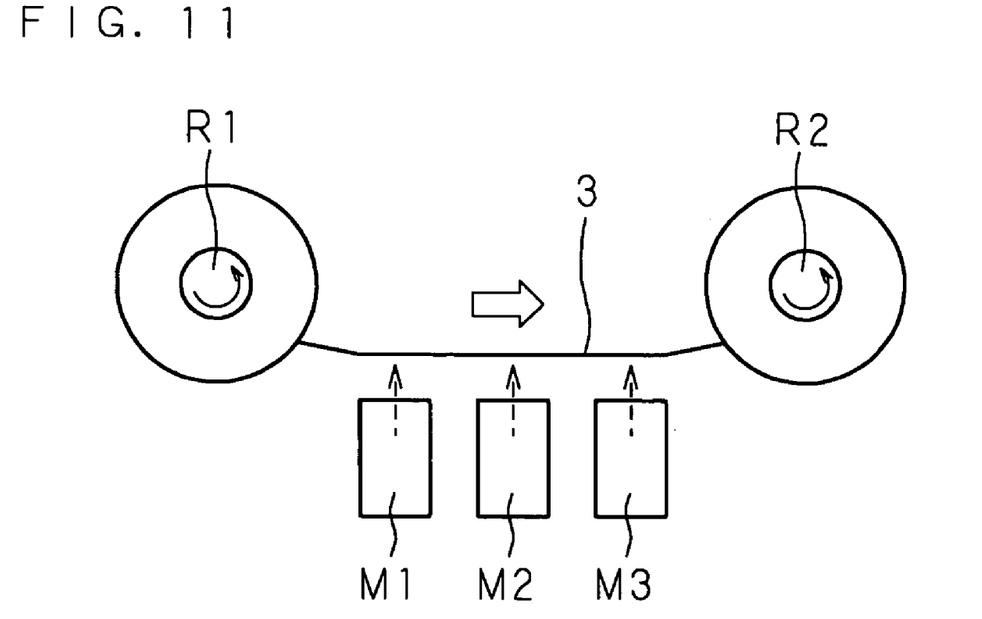
FIG. 11 is an explanatory view of the manufacturing method of the circuit substrate according to the present invention.
Figure 12:
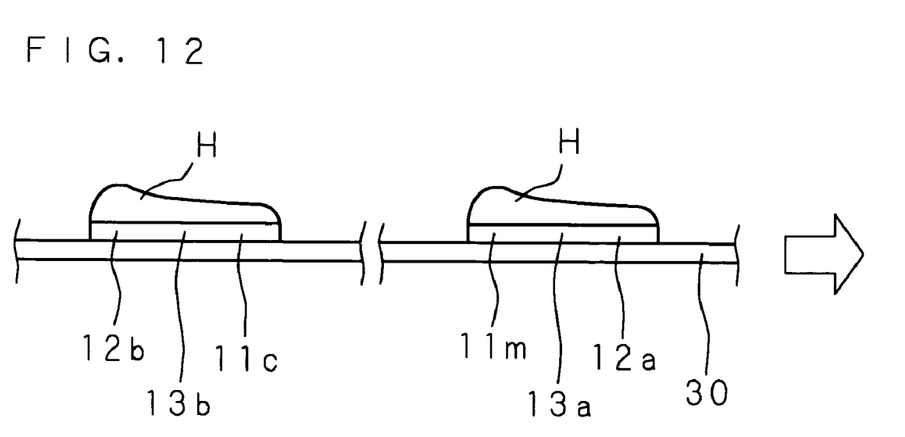
FIG. 12 is a sectional view taken along XII-XII line in FIG. 10.

FIG. 9 is a plan view showing the construction of a substrate sheet 3 for cutting the circuit substrate 4. FIG. 10 is an expanded plan view showing the construction in the vicinity of the external electrodes 11*m*, 11*c*, 21*m*, 21*c* provided on the substrate sheet 3. FIG. 11 is an explanatory view of the manufacturing method of the circuit substrate according to the present invention. FIG. 12 is a sectional view taken along the line XII-XII in FIG. 10.

In the substrate sheet 3, a plurality of substantially rectangular regions 300 corresponding to the circuit substrate 4 are provided on a belt-like insulating film 30. The regions 300 are placed in parallel to each other in the longitudinal direction of each region 300, and the longitudinal direction of each region 300 is set to coincide with the widthwise direction of the insulating film 30. As will be described later, by cutting the substrate sheet 3 along the outline of the region 300, the circuit substrate 4 is cut. Hereafter, one region 300 will be explained.

All parts to be provided on the circuit substrate 4 are formed in the region 300.

On the insulating film 30, belt-like extending conductors 13*a*, 23*a*, 13*b*, 23*b* are provided in a state of extending to the outside the region 300 from the external individual electrodes 11*m*, 11*c* and the external earth electrodes 21*m*, 21*c* of the circuit substrate 4, vertical to the parallel direction of these electrodes. Extending directions to the outside from the external electrodes 11*m*, 21*m* of the extending conductors 13*a*, 23*a* of one line and extending directions to the outside from the external electrodes 11*c*, 21*c* of the extending conductors 13*b*, 23*b* of the other line are made reverse to each other.

The widths of the extending conductors 13*a*, 13*b*, 23*a*, 23*b* (lengths in the extending direction and the vertical direction) are smaller than the widths of the external electrodes 11*m*, 11*c*, 21*m*, 21*c*, and set at about 0.12 mm.

Substantially rectangular probing electrodes 12*a*, 12*b*, 22*a*, 22*b* connected to the external electrodes 11*m*, 11*c*, 21*m*, 21*c* through the extending conductors 13*a*, 13*b*, 23*a*, 23*b* are formed outside the region 300.

The widths of the probing electrodes 12*a*, 12*b*, 22*a*, 22*b* are larger than the widths of the extending conductors 13*a*, 13*b*, 23*a*, 23*b*, larger than the widths of the external electrodes 11*m*, 11*c*, 21*m*, 21*c*, and set at about 0.2 mm.

The probing electrodes 12*a*, 12*b*, 22*a*, 22*b* are provided in parallel to each other in the longitudinal direction of the region 300. The zigzag arrangement is formed at a different position, in the widthwise direction of the region 300, i.e. in the extending directions of the extending conductors 13*a*, 13*b*, 23*a*, 23*b*. Accordingly, in the extending conductors 23*a*, 23*a*, 13*a*, 13*a*, . . . , 23*a*, 23*a*, 23*a*, the extending conductors 13*a*, 13*a*, the extending conductors 23*a*, 23*a*, and the extending conductors 13*a* and the extending conductors 23*a* adjacent to each other in the longitudinal direction of the region 300 have different lengths.

The probing electrodes 12*a*, 12*b*, 22*a*, 22*b* are respectively used in the conduction test of each external electrode 11*c*, 11*m*, 21*c*, 21*m*, the IC chip 40 and the terminal part 41.

After completing the conduction test, the solder H, which is the conductive brazing material, is adhered to the surfaces of the external electrodes 11c, 11m, 21c, 21m, respectively and the terminal part 41 as described below. Specifically, in the insulating film 30, the surface (referred to as an electrode forming face) formed with the external electrodes 11c, 11m, 21c, 21m is faced downside. The insulating film 30 is carried to an arrangement direction of each region 300 (the extending direction of the extending conductors 13a, 13b, 23a, 23b, i.e. the direction shown by hollow arrow in FIG. 9 to FIG. 12). Thus, the external electrodes 11c, 11m, 21c, 21m and the terminal part 41 pass over the solder H tanks M3, M3 that blow up the solder H previously heated and fused. However, the part on which the IC chip 40 is mounted does not pass over the solder H tank M3.

Further specifically, as shown in FIG. 11, first, the substrate sheet 3 is set on the reel of a sheet supply part R1 in a state of being wound into a roll. The substrate sheet 3 is sent from the sheet supply part R1, with the electrode forming face faced downside. Each external electrode 11c, 11m, 21c, 21m, each probing electrode 12a, 12b, 22a, 22b, and each extending conductor 13a, 13b, 23a, 23b, and the terminal part 41 on the electrode forming face are coated with flux, with the substrate sheet 3 elongated in a plat shape and passed through a flux blow device M1.

Next, each external electrode 11c, 11m, 21c, 21m, each probing electrode 12a, 12b, 22a, 22b, each extending conductor 13a, 13b, 23a, 23b, and the terminal part 41 are heated (previous heating), with the substrate sheet 3 passed through a heater M2. The solder H is hardly adhered to the insulating film 30, and therefore the solder H is adhered to the surface of each external electrode 11c, 11m, 21c, 21m, each probing electrode 12a, 12b, 22a, 22b, and each extending conductor 13a, 13b, 23a, 23b, and the terminal part 41, with the substrate sheet 3 passed over the solder H tanks M3, M3.

Finally, the substrate sheet 3 is wound into a roll on the reel of a sheet winding part R2, after the solder H adhered to the surface of each external electrode 11c, 11m, 21c, 21m, each probing electrode 12a, 12b, 22a, 22b, each extending conductor 13a, 13b, 23a, 23b, and the terminal part 41 is cured.

The substrate sheet 3 is sent from the sheet winding part R2 and is punched out along the outline of the region 300 by a punching device not shown, for example. Thus, the circuit substrate 4 is formed, including each external electrode 11c, 11m, 21c, the IC chip 40 and the terminal part 41, and not including each probing electrode 12a, 12b, 22a, 22b and each extending conductor 13a, 13b, 23a, 23b. The punching is performed in the vicinity of a connection part (at the position shown by two-dot chain lain in FIG. 10) between the external individual electrodes 11m, 11c, 21m, 21c, and the extending conductors 13a, 13b, 23a, 23b.

The solder H adhered and cured on each external electrode 11c, 11m, 21c, 21m is heated and fused again, when the electrodes are connected by layering the circuit substrate 4 on the piezoelectric actuator plate 52. The solder H adhered to the terminal part 41 is heated and fused again, when the terminal part 41 is connected to the connector of the print board 71.

Specifically, when the external electrodes 11c, 11m and the external electrodes 21c, 21m of the circuit substrate 4 are respectively connected to the first individual electrodes 521m, 521c and the external earth electrodes 522m, 522c provided in the piezoelectric actuator plate 52, the narrow portion of the circuit substrate 4 is arranged on the upside of the piezoelectric actuator plate 52. The solder H on the surface of the external electrodes 11c, 11m, 21c, 21m is heated and fused from the surface opposite to the electrode forming face of the circuit substrate 4. The solder H thus heated and fused is brought into contact with the first individual electrodes 521m, 521c and the first earth electrodes 522m, 522c, respectively, to connect them.

TABLE 1

|  | top end side (μm) | tail end side (μm) | difference (μm) |
| --- | --- | --- | --- |
| embodiment | 4.86 | 5.60 | 0.74 |
| prior art | 3.31 | 4.55 | 1.24 |

Table 1 shows results of measuring thicknesses of the solder H adhered on the external individual electrodes 11c, 11m in the embodiment and those on the external electrodes 24a, 24b in the prior art. Specifically, in the upper column, Table 1 shows the thickness of the solder H adhered to the surface of the external individual electrode 11c of the top end side in a passing direction of the substrate sheet 3 over the solder tank M3 (FIG. 12) in relation to the external individual electrodes 11c, the probing electrodes 12b, and the extending conductors 13b formed continuously on the one lateral side. Table 1 also shows the thickness of the solder H adhered to the surface of the external individual electrode 11m of the tail end side in the passing direction in relation to the external individual electrode 11m, the probing electrode 12a, and the extending conductor 13a on the other lateral side, and the difference between these thicknesses.

In the lower column, Table 1 shows, corresponding to the results in the embodiment, the thicknesses of the solder H adhered to the surfaces of the external electrode 24a of the top end side and the external electrode 24b of the tail end side in the passing direction (FIG. 3), and the difference between these thicknesses.

As shown in Table 1, the difference between the thickness of the solder H (4.86 μm) adhered to the surface of the external individual electrode 11c of the top end side in the passing direction, and the thickness of the solder H (5.60 μm) adhered to the surface of the external individual electrode 11m of the tail end side in the passing direction is 0.74 μm. Meanwhile, the difference between the thickness of the solder H (3.31 μm) adhered to the surface of the external electrode 24a of the top end side in the passing direction and the thickness of the solder H (4.55 μm) adhered to the surface of the external electrode 24b of the tail end side in the passing direction is 1.24 μm in the prior art. Namely, in this embodiment, the thickness of the solder H is reduced.

This is considered such that since the widths of the extending conductors 13a, 13b are smaller than the widths of the external individual electrodes 11m, 11c and the probing electrodes 12a, 12b, the solder storage part is formed by the surface tension of the solder in the wide portion in the width changing part between electrodes and conductors, making it difficult to allow the solder H to flow to the extending conductors 13a, 13b from the probing electrodes 12a, 12b, and to the extending conductors 13a, 13b from the external individual electrodes 11c, 11m. That is, the solder H on the external individual electrode 11m is prevented from being made thicker. In addition, since the solder H is hardly flows to the extending conductor 13b from the external individual electrode 11c, the solder H on the external individual electrode 11c is prevented from being made excessively thinner. Also, in the case of the external earth electrodes 21m, 21c, the solder adhered thereto is prevented from being made excessively thicker or thinner.

As a result, the solder H of a necessary sufficient amount is adhered to the surfaces of the external electrodes 11m, 11c, 21m, 21c, and therefore a connection failure due to insufficient solder amount and a short-circuiting due to excessive amount of solder can be prevented.

In addition, since the difference of solder H on the surface of the external electrodes 11m, 11c, 21m, 21c is small, the solder H is almost simultaneously fused and the external individual electrodes 11m, 11c are simultaneously brought into contact with the first individual electrodes 521m, 521c and the first earth electrodes 522m, 522c, thus obtaining an excellent connection.

In addition, the probing electrodes 12a, 12b, 22a, 22b are arranged in a zigzag manner, thereby making the area of each probing electrode 12a, 12b, 22a, 22b sufficiently larger.

The separation distance of the external electrodes 11a, 11b, 21a, 21b can be made small, respectively, while the areas of the probing electrodes 12a, 12b, 22a, 22b are made large, respectively. Namely, the widths of the external electrodes 11m, 11c, 21m, 21c can be made large. An adhesion by the solder H between the external electrodes 11m, 11c, 21m, 21c, and the first individual electrodes 521m, 521c and the first earth electrodes 522m, 522c is made strong. It becomes difficult to peel off the circuit substrate 4 from the piezoelectric actuator plate 52. Alternately, the pitch either of in a direction of the line of the external electrodes 11c, 21c or the line of the external electrodes 11m, 21m can be made small, and the nozzle holes can be arranged with higher density.

In addition, although the probing electrodes 12a, 22a and the probing electrodes 12b, 22b are arranged in a zigzag manner in the embodiments, by sequentially making the adjacent conductors longer, the positions of the probing electrodes may be sequentially displaced.

As this invention may be embodied in several forms without departing from the spirit of essential characteristics thereof, the present embodiments are therefore illustrative and not restrictive, since the scope of the invention is defined by the appended claims rather than by description preceding them, and all changes that fall within metes and bounds of the claims, or equivalence of such metes and bounds thereof are therefore intended to be embraced by the claims.

What is claimed is:

1. A substrate sheet, on one surface thereof comprising:
   a plurality of external electrodes provided inside an substantially rectangular region corresponding to a circuit substrate to be manufactured along at least one side of the region, to be connected with an external equipment;
   a plurality of extending conductors, each of which is extending from respective external electrode to the outside the region; and
   a plurality of probing electrodes each of which is connected to respective external electrode through the corresponding extending conductor, to perform a conduction test,
   wherein a width of the extending conductor is smaller than both of lengths, in a widthwise direction of the extending conductor, of each external electrode and probing electrode.

2. The substrate sheet according to claim 1, wherein
   a plurality of external electrodes are provided along one side facing said at least one side, and
   the extending conductors extending to the outside of the region from the external electrodes along each side extend in opposite directions.

3. The substrate sheet according to claim 1, wherein
   the probing electrodes are arranged in a zigzag manner, each probing electrode being different from the adjacent probing electrode in position in a longitudinal direction of the extending conductor, and
   the length of the probing electrode in the widthwise direction is not smaller than the lengths of the external electrodes in the widthwise direction.

4. The substrate sheet according to claim 1, wherein
   a plurality of substantially rectangular regions corresponding to the circuit substrate to be manufactured are arranged such that a plurality of sets of the external electrodes, each set of which corresponds to each substantially rectangular region respectively and which forms a line, are arranged in parallel.

5. The substrate sheet according to claim 1, wherein
   the plurality of substantially rectangular regions corresponding to the circuit substrate to be manufactured are arranged in parallel to each other in the lengthwise direction, and the lengthwise direction is almost vertical to the lengthwise direction of the substrate sheet.

6. The substrate sheet according to claim 1, wherein
   the substrate sheet is formed in a belt-like shape to be wound on a reel, so as to be moved in the lengthwise direction of the extending conductor during providing a conductive brazing material, and is made of insulation resin.

7. An ink jet head on which at least one ink cartridge is mounted, comprising:
   a frame for freely removably holding said at least one ink cartridge;
   a substrate provided at one side of the frame, having a connector at one side edge thereof for supplying a signal;
   a circuit substrate, which is connected to the connector, comprising:
      a plurality of external electrodes provided inside an substantially rectangular region corresponding to the circuit substrate to be manufactured along at least one side of the region, to be connected with an external equipment;
      a plurality of probing electrodes each of which is connected to respective external electrode through the corresponding extending conductor, to perform a conduction test; and
      a plurality of extending conductors, each of which is extending from respective external electrode to the outside the region, wherein a width of the extending conductor is smaller than both of lengths, in a widthwise direction of the extending conductor, of each external electrode and probing electrode,
      wherein a conductive brazing material is adhered to the surfaces of the external electrodes, and the substrate sheet is cut along the substantially rectangular regions to form the circuit substrate; and
   a recording head provided at another side of the frame, having a plurality of nozzle holes for ejecting an ink fed from said at least one ink cartridge to a recording medium, wherein the recording head connects to the external electrodes of the circuit substrate.

* * * * *